(12) United States Patent
Bae et al.

(10) Patent No.: US 6,240,041 B1
(45) Date of Patent: May 29, 2001

(54) SIGNAL GENERATOR WITH TIMING MARGIN BY USING CONTROL SIGNAL TO CONTROL DIFFERENT CIRCUIT

(75) Inventors: Sung-Ho Bae; Jong-Hee Han, both of Ichon-shi (KR)

(73) Assignee: Hyundai Electronics Industries Co., Ltd., Ichon (KR)

(*) Notice: Subject to any disclaimer, the term of this patent is extended or adjusted under 35 U.S.C. 154(b) by 0 days.

(21) Appl. No.: 09/465,758

(22) Filed: Dec. 17, 1999

(30) Foreign Application Priority Data

Dec. 30, 1998 (KR) .................................................. 98-61096

(51) Int. Cl.$^7$ ........................................................ G11C 8/00

(52) U.S. Cl. ................ 365/230.08; 365/230.06; 365/189.05

(58) Field of Search ........................ 365/230.08, 230.06, 365/189.05, 191, 189.11

(56) References Cited

U.S. PATENT DOCUMENTS 5,859,799 * 1/1999 Matsumoto et al. ............ 365/189.09
6,065,092 * 5/2000 Roy .......................................... 711/5

* cited by examiner

*Primary Examiner*—David Nelms
*Assistant Examiner*—Thong Le
(74) *Attorney, Agent, or Firm*—Jacobson, Price, Holman & Stern, PLLC

(57) ABSTRACT

Disclosed is a semiconductor memory device capable of improving a timing margin in a logic circuit using a signal latch. The semiconductor memory device according to the present invention includes an address generator including a latch circuit, wherein the address generator receives an external address signal from an external circuit and latches the external address signal in response to a control signal; and a Y-predecoder for receiving outputs from the address generator and for generating a pulse in response to the control signal. Accordingly, the semiconductor memory device according to the present invention transfers a signal at safety without considering a separate timing margin, by using the control signal in an adjacent circuit as an enable signal.

16 Claims, 7 Drawing Sheets

SIGNAL GENERATOR WITH TIMING MARGIN BY USING CONTROL SIGNAL TO CONTROL DIFFERENT CIRCUIT

FIELD OF THE INVENTION

The present invention relates to a semiconductor memory device; and, more particularly, to a semiconductor memory device capable of improving a timing margin in a logic circuit using a signal latch.

DESCRIPTION OF THE PRIOR ART

Generally, semiconductor memory devices have employed latch circuits for stability of signal transmission. An example having the latch circuits is shown in FIG. 1A. FIG. 1A is a schematic block diagram illustrating a concept of signal transmission between an address signal generator and an Y-predecoder and FIG. 1B is a detail circuit diagram illustrating the Y-predecoder.

Referring to FIGS. 1A and 1B, first to fourth output signals gy0 to gy3 are output under the control of a control signal ypc. That is, input address signals are decoded in the Y-predecoder and then a bit line connected to a specific cell is selected. These output signals from the Y-predecoder are controlled by the control signal ypc from an external circuit.

FIG. 1C is a waveform illustrating a signal generation with a true timing in FIG. 1. As shown in FIG. 1C, when the control signal ypc is input within an exact margin for the input address signals iadd_p<1> and iadd_p<2>, the first output signal gy0 is output in logically low level during the corresponding section (the second to fourth output signals gy1 to gy3 are continuously in a high level).

However, in the case where the control signal ypc is abnormally input at a rising or falling edge of the input address signal, an undesired decoding output signal is may be output, thereby deteriorating its reliability. As a result, this undesired decoding output signal makes cell data incorrect. To prevent this incorrect output data signal, it is possible to provide the timing margin for the control signal ypc in order to obtain the reliability in the signal processing with a false timing, as shown in FIG. 1D. However, with the increase of the operation frequency in highly integrated circuits, this margin is subject to restriction.

SUMMARY OF THE INVENTION

It is, therefore, an object of the present invention to provide a memory device capable of transferring a signal at safety on a signal path having a latch circuit, without considering a separate timing margin.

It is another object of the present invention to provide an address signal generator making it stable to produce address signals in DRAMs, SDRAMs, or DDR SDRAMs.

In accordance with an aspect of the present invention, there is provided a semiconductor memory device comprising: a signal generator including a latch circuit, wherein the signal generator receives an external signal from an external circuit and latches the external signal in response to a control signal; and a pulse generating means for receiving outputs from the signal generator and for generating a pulse in response to the control signal.

The semiconductor memory device in accordance with the present invention further comprises a precharge means for precharging an output terminal of the signal generator in response to the control signal.

The signal generator in accordance with the present invention includes a CMOS inverter receiving the external signal and wherein the control signal enables the CMOS inverter.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a signal transmission according to the present invention will be described in detail, referring to the accompanying drawings.

Figure 1A:
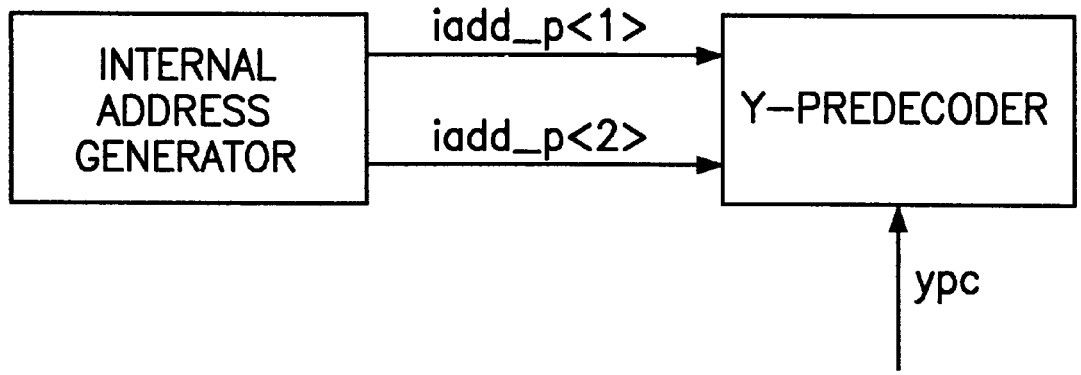
FIG. 1A is a schematic block diagram illustrating a concept of a conventional signal transmission between an address signal generator and an Y-predecoder.
Figure 2A:
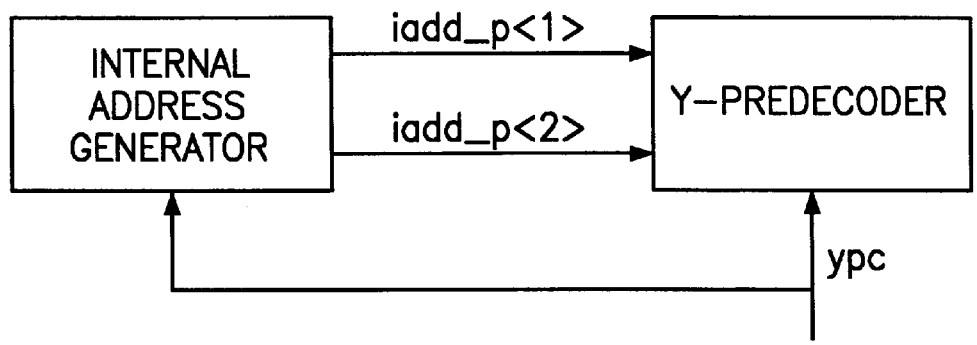
FIG. 2A is a schematic block diagram illustrating an concept of a signal transmission between an address signal generator and a Y-predecoder according to the present invention.
Figure 2B:
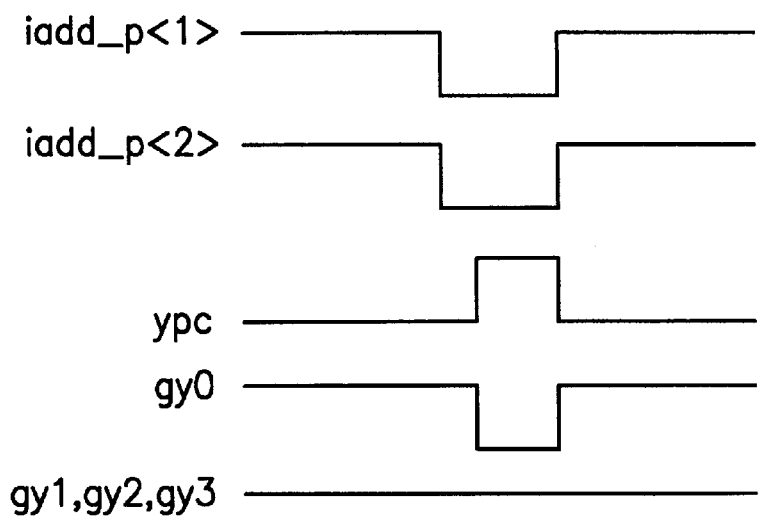
FIG. 2B is a waveform illustrating a signal generation with a true timing in FIG. 1.

First, the signal transmission according to the present invention is described between an address generator and an Y-predecoder in FIG. 2A. Comparing with the signal transmission in FIG. 1A in which a control signal is input only into the Y-predecoder, a control signal ypc according to the present invention is input into the address generator as well as the Y-predecoder. As shown in FIG. 2B, since both the Y-predecoder and the address generator are simultaneously controlled by one control signal, an additional timing margin is not needed and an exact signal transmission may be achieved.

Figure 3:
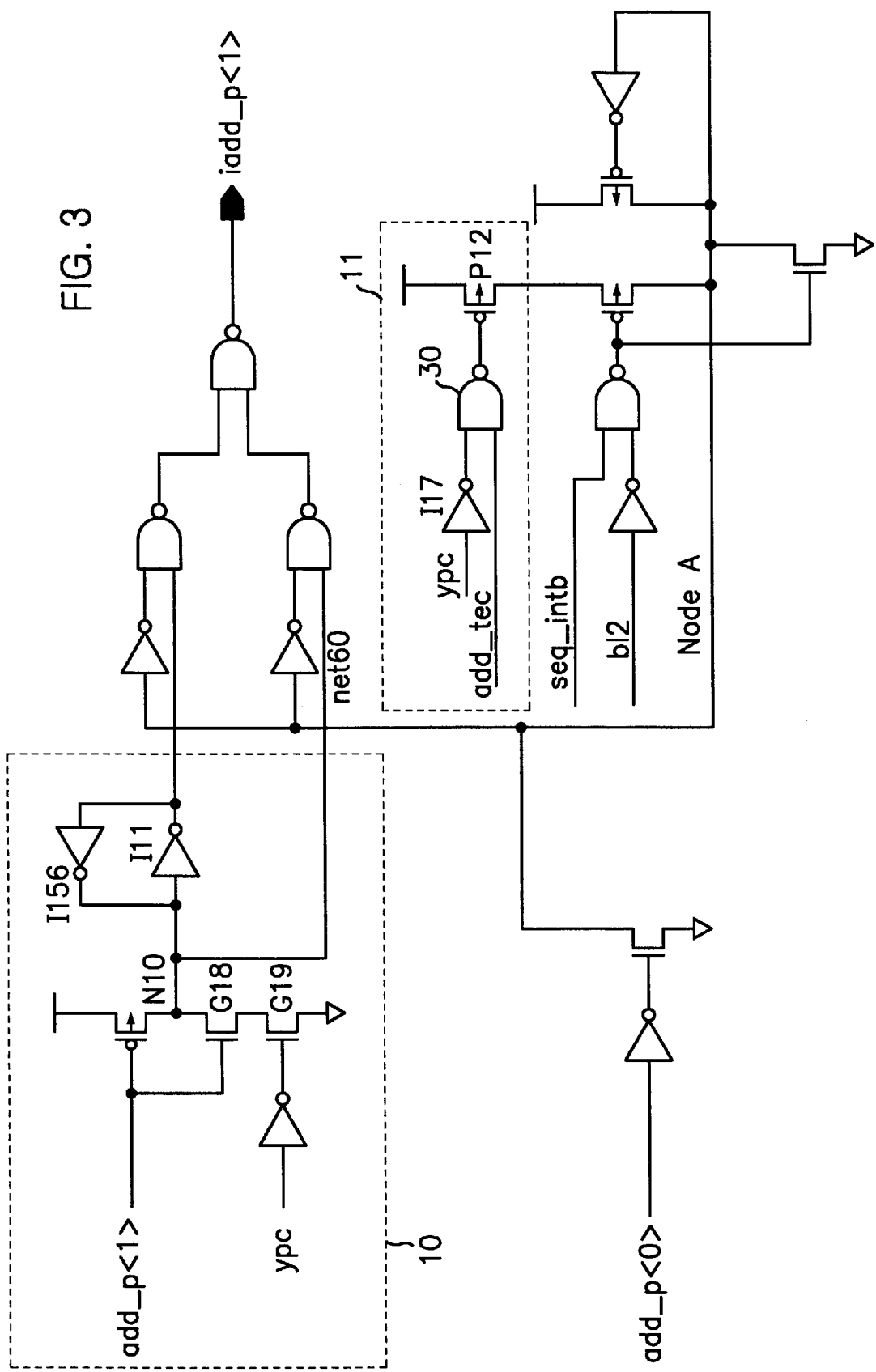
FIG. 3 is a block diagram illustrating the address generator according to an embodiment of the present invention.

Referring to FIG. 3 showing the detailed circuit diagram of the address generator in FIG. 2A, the address generator according to the present invention receives a control signal which is received by the Y-predecoder. Although outputs from address buffers are decoded in the Y-predecoder, which is in the next stage, in response to the control signal ypc, the address signals according to the present invention are also output in response to the control signal ypc. That is, the only difference between the conventional address generator and the address generator in FIG. 3 is the use of the control signal ypc. The control signal ypc controls the Y-predecoder and also it enables the address generator which is in the previous stage of the Y-predecoder. Particularly, since outputs of the address signals transferred through a latch circuit is determined in response to the control signal ypc, the above problem to require a margin in the signal transmission may be solved based on the internal address signal input in response to the control signal ypc of the Y-predecoder.

For convenience's sake, FIG. 3 shows an internal column address buffer in a DDR SDRAM, which is a circuit for producing an internal address signal iadd_p<1> using an external column address signal add_p<0>, a burst length and address counting mode information. However, the present invention may be applied to different circuits having a latch circuit.

Figure 1B:
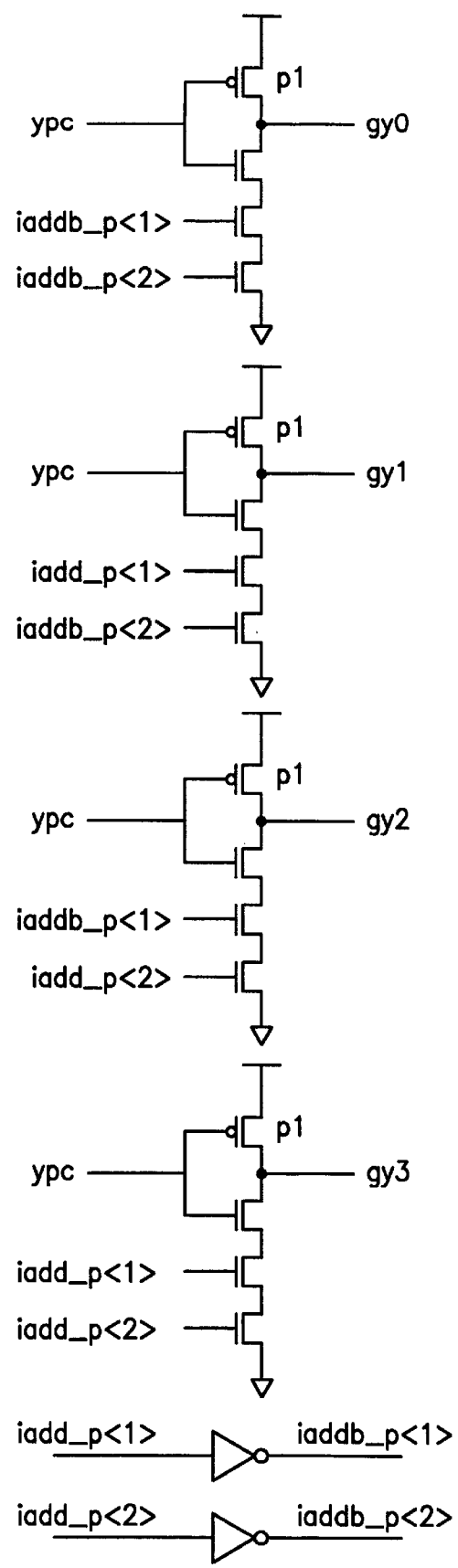
FIG. 1B is a detail circuit diagram illustrating the Y-predecoder.
Figure 1C:
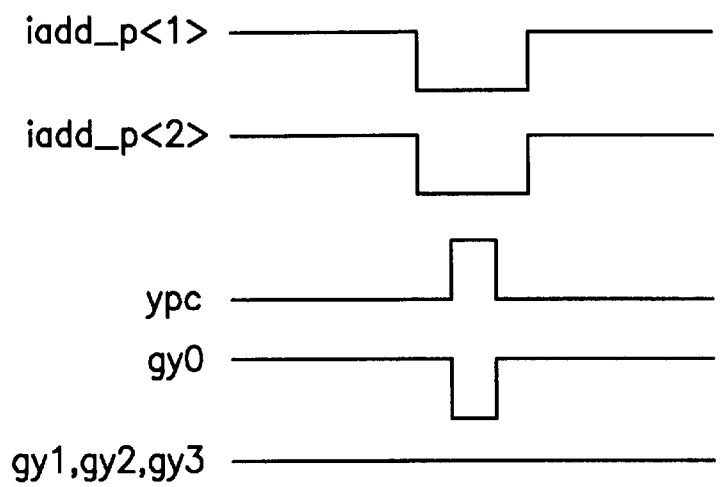
FIG. 1C is a waveform illustrating a signal generation with a true timing in FIG. 1.
Figure 1D:
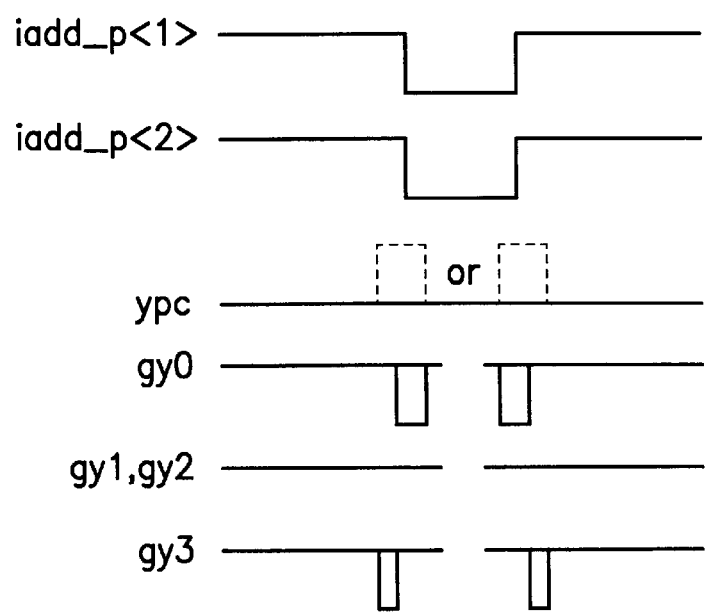
FIG. 1D is a waveform illustrating a signal generation with a false timing in FIG. 1.

Referring again to FIG. 3, the internal address buffer according to the present invention receives the control signal ypc in an address input part 10 and a precharge part 11. In the address input part 10, when the control signal ypc in a low level is input, an NMOS transistor G19 is turned on and, when an external address signal add_p<1> in a high level is applied to an NMOS transistor G18, the NMOS transistor G18 is turned on. Node N10 is in a ground voltage level so that a latch circuit having two inverters I156 and I11 stores a high level data. At this time, a PMOS transistor P1 in FIG. 1B is turned on.

On the other hand, when the control signal ypc in a high level is input, an NMOS transistor G19 is turned off and the potential on node N10 is floated to produce internal address signals. At this time, a PMOS transistor P1 in FIG. 1B is turned off so that a decoding is carried out according to the internal address signals. If the internal address signals iadd_p<1> and iadd_p<2> are in a low level, a decoding output signal gyo may be in a low level.

Typically, to process subsequently input address signals, a data collision must be prevented after processing one input address signal. This data collision may be prevented by a precharge circuit 11. The precharge circuit 11 includes an inverter I17 for inverting the control signal ypc. Accordingly, when the control signal ypc is in a low level and a precharge signal add_tce is in a high level, a PMOS transistor P12 is turned on (NANDing the control signal ypc and the precharge signal add_tce) . The use of the control signal ypc in the precharge circuit further increases the stability of the signal transmission.

Furthermore, it is not necessary to consider the timing margin in various logic circuits of semiconductor devices, in which a signal transmission are carried out, by using the control signal ypc of an adjacent other logic circuit as an enable signal.

Figure 4:
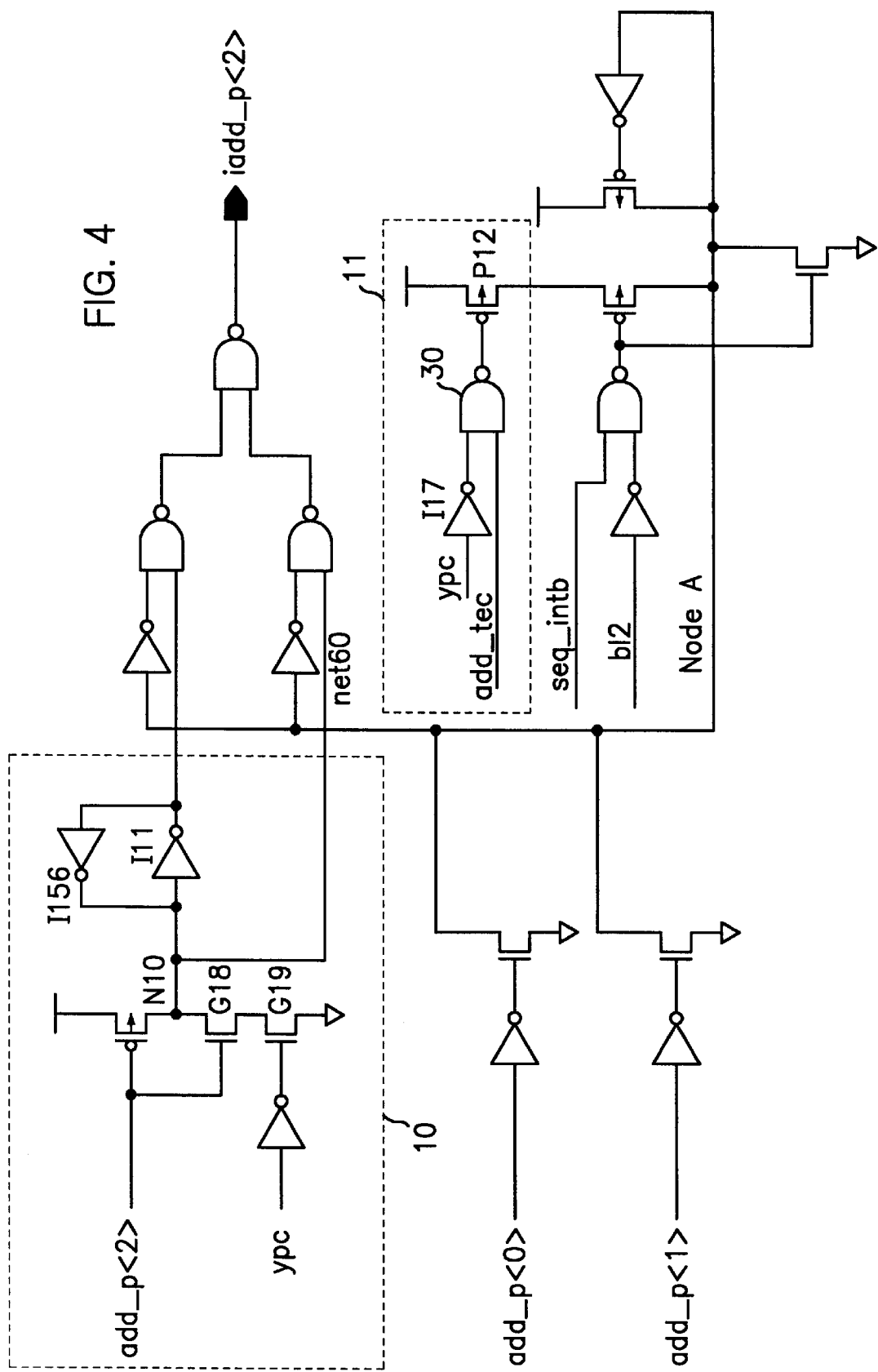
FIG. 4 is a block diagram illustrating the address generator according to another embodiment the present invention.

FIG. 4 shows another internal column address buffer in a DDR SDRAM, which is a circuit for producing an internal address signal iadd_p<2> using external column address signals add_p<0> and add_p<1>, a burst length and address counting mode information, in which the control signal ypc is used as an enable signal, as described in FIG. 3.

Figure 5:
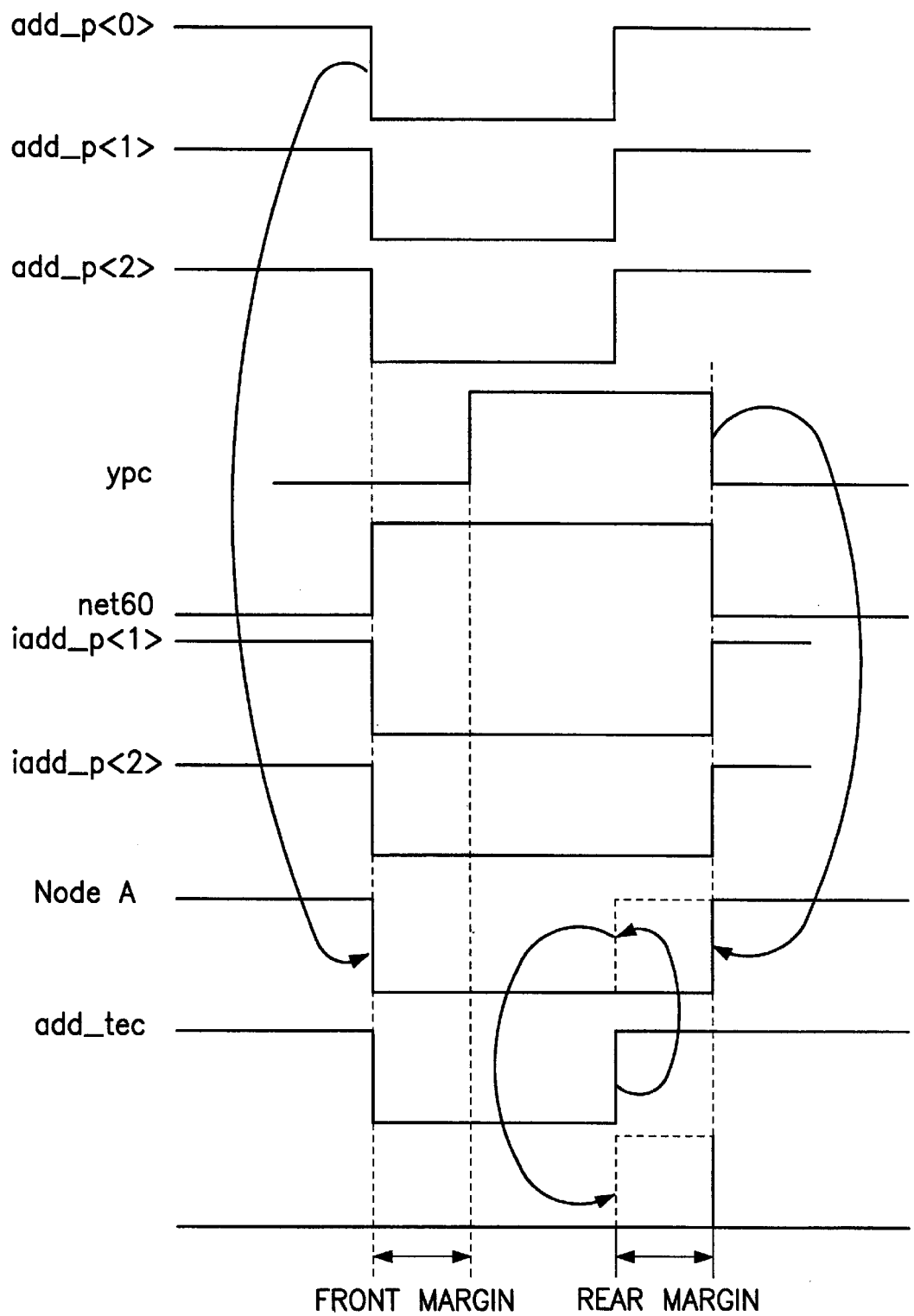
FIG. 5 is a timing chart illustrating stability of the signal transmission in FIGS. 3 and 4.

FIG. 5 is a timing chart illustrating stability of the signal transmission in FIGS. 3 and 4. As shown in FIG. 5, although the control signal ypc is not within the pulse width of the external column address signal add_p<1>, the normal output (iadd_p<1>) is output. That is, the internal address signal iadd_p<1> is output in the same waveform as the control signal ypc, thereby ensuring a rear margin.

As apparent from the above, the present invention transfers a signal at safety without considering a separate timing margin, by using the control signal in an adjacent circuit as an enable signal. This timing margin makes it easy to design logic circuits in high speed memory devices. Also, the present invention has an effect on the address signal generator, by obtaining the rear margin of the output signal in the address buffers of memory devices.

Although the preferred embodiments of the invention have been disclosed for illustrative purposes, those skilled in the art will appreciate that various modifications, additions and substitutions are possible, without departing from the scope and spirit of the invention as disclosed in the accompanying claim.

What is claimed is:

1. A semiconductor memory device comprising:
   a signal generator including a latch circuit, wherein the signal generator receives an external signal from an external circuit and latches the external signal in response to a control signal; and
   a pulse generating means for receiving outputs from the signal generator and for generating a pulse in response to the control signal.

2. The semiconductor memory device as recited in claim 1, further comprising a precharge means for precharging an output terminal of the signal generator in response to the control signal.

3. The semiconductor memory device as recited in claim 1, wherein the signal generator includes a CMOS inverter receiving the external signal and wherein the control signal enables the CMOS inverter.

4. The semiconductor memory device as recited in claim 2, wherein the precharge means receives a precharge signal and the control signal and precharges the output terminal of the signal generator by NANDing the precharge signal and the control signal.

5. The semiconductor memory device as recited in claim 2, wherein the signal generator is an internal address generator and wherein the pulse generating means is a Y-predecoder receiving internal address signals from the signal generator.

6. The semiconductor memory device as recited in claim 1, wherein the latch circuit includes:
   a first inverter for inverting the control signal to output an inverted control signal;
   a PMOS transistor having a source coupled to a power potential and a gate receiving the external signal;
   a first NMOS transistor having a drain coupled to a drain of the PMOS transistor, and a gate receiving the external signal;
   a second NMOS transistor having a drain coupled to a source of the first NMOS transistor, a source coupled to a ground potential and a gate receiving the inverted control signal;
   a second inverter having an input terminal receiving a signal outputted from the drain of the PMOS transistor; and
   a third inverter having an input terminal coupled to an output terminal of the second inverter, and an output terminal coupled to the input terminal of the second inverter.

7. The semiconductor memory device as recited in claim 6, wherein the external signal is an external address signal.

8. The semiconductor memory device as recited in claim 2, wherein the precharge means includes:
   an inverter for inverting the control signal to output an inverted control signal;
   a NAND gate for NANDing the inverted control signal and a precharge signal; and
   a PMOS transistor responsive to an output signal of the NAND gate.

9. A semiconductor memory device for improving a timing margin in a logic circuit comprising:
   a signal generator including a latch circuit, said signal generator receiving an external signal from an external circuit and latching the external signal in response to a control signal; and
   a pulse generating means for receiving outputs from the signal generator and for generating a pulse in response to the control signal;

wherein use of the same control signal by the signal generator and the pulse generating means permits safe signal transfer without consideration of a separate timing margin.

10. The semiconductor memory device as recited in claim 9, further comprising a precharge means for precharging an output terminal of the signal generator in response to the same control signal.

11. The semiconductor memory device as recited in claim 9, wherein the latch circuit includes:

a first inverter for inverting the control signal to output an inverted control signal;

a PMOS transistor having a source coupled to a power potential and a gate receiving the external signal;

a first NMOS transistor having a drain coupled to a drain of the PMOS transistor, and a gate receiving the external signal;

a second NMOS transistor having a drain coupled to a source of the first NMOS transistor, a source coupled to a ground potential and a gate receiving the inverted control signal;

a second inverter having an input terminal receiving a signal outputted from the drain of the PMOS transistor; and a third inverter having an input terminal coupled to an output terminal of the second inverter, and an output terminal coupled to the input terminal of the second inverter.

12. The semiconductor memory device as recited in claim 9, wherein the external signal is an external address signal.

13. The semiconductor memory device as recited in claim 10, wherein the precharge means includes:

an inverter for inverting the control signal to output an inverted control signal;

a NAND gate for NANDing the inverted control signal and a precharge signal; and a PMOS transistor responsive to an output signal of the NAND gate.

14. A semiconductor memory device for signal transmission without consideration of a separate timing margin comprising:

a signal generator including a latch circuit, said signal generator receiving an external address signal from an external circuit and latching the external address signal in response to a control signal; and a pulse generating means for receiving outputs from the signal generator and for generating a pulse in response to the same control signal; and a precharge circuit for precharging an output terminal of the signal generator in response to the same control signal as used by said signal generator and said pulse generating means.

15. The semiconductor memory device as recited in claim 14, wherein the latch circuit includes:

a first inverter for inverting the control signal to output an inverted control signal;

a PMOS transistor having a source coupled to a power potential and a gate receiving the external signal;

a first NMOS transistor having a drain coupled to a drain of the PMOS transistor, and a gate receiving the external signal;

a second NMOS transistor having a drain coupled to a source of the first NMOS transistor, a source coupled to a ground potential and a gate receiving the inverted control signal;

a second inverter having an input terminal receiving a signal outputted from the drain of the PMOS transistor; and a third inverter having an input terminal coupled to an output terminal of the second inverter, and an output terminal coupled to the input terminal of the second inverter.

16. The semiconductor memory device as recited in claim 14, wherein the precharge means includes:

an inverter for inverting the control signal to output an inverted control signal;

a NAND gate for NANDing the inverted control signal and a precharge signal; and a PMOS transistor responsive to an output signal of the NAND gate.

* * * * *